(12) United States Patent
Shiozaki

(10) Patent No.: US 7,141,449 B2
(45) Date of Patent: Nov. 28, 2006

(54) METHOD OF FABRICATING A COMPOUND SEMICONDUCTOR THIN-LAYER SOLAR CELL

(75) Inventor: Satoshi Shiozaki, Sayama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 89 days.

(21) Appl. No.: 11/005,622

(22) Filed: Dec. 3, 2004

(65) Prior Publication Data

US 2005/0161076 A1    Jul. 28, 2005

(51) Int. Cl.
*H01L 21/00* (2006.01)
(52) U.S. Cl. ............... 438/94; 438/95; 257/E21.116
(58) Field of Classification Search ............... None
See application file for complete search history.

(56) References Cited

U.S. PATENT DOCUMENTS 4,343,881 A * 8/1982 Sher et al. ............ 430/57.5
4,611,091 A   9/1986 Choudary et al. ........ 136/260
6,974,976 B1 * 12/2005 Hollars .................... 257/184

FOREIGN PATENT DOCUMENTS

JP          8-330614          12/1996

* cited by examiner

*Primary Examiner*—Michael Lebentritt
*Assistant Examiner*—Cheung Lee
(74) *Attorney, Agent, or Firm*—Fulbright & Jaworski L.L.P.

(57) ABSTRACT

A method of fabricating a thin-film compound solar cell having an n-type buffer layer formed therein for providing a heterojunction with a p-type compound semiconductor light absorbing layer formed on a back electrode by spreading a powder of a sulfur compound containing n-type doping element over the light absorbing layer surface or applying a coat of a solution of a sulfur compound containing n-type doping element onto the light absorbing layer surface and then fusing the powder or the coat thereon by heat. This process can produce a high-quality n-type buffer layer tightly adhered to a p-type compound semiconductor light absorbing layer to achieve stable characteristic of heterojunction therewith.

2 Claims, 6 Drawing Sheets

METHOD OF FABRICATING A COMPOUND SEMICONDUCTOR THIN-LAYER SOLAR CELL

BACKGROUND OF THE INVENTION

The present invention relates to a method of fabricating a compound semiconductor thin-film solar cell having a p-type light absorbing layer with an n-type heterojunction buffer layer formed thereon.

FIG. 1 shows a basic structure of a thin-film solar cell produced from a general compound semiconductor, which comprises a SLG (soda lime glass) substrate 1 on which a back molybdenum (Mo) electrode layer (positive electrode) 2, a p-type light absorbing layer 5, an n-type heterojunction buffer layer 6 and a transparent electrode layer (negative electrode) 7 are subsequently formed in the described order.

In the thin-film compound semiconductor solar cell, the light absorbing layer 5 is produced in the form of a CIGS (Copper-Indium-Gallium-Selenium) thin film made of Cu (In+Ga) Se2 of I–III–VI2 group based on Cu, (In, Ga), Se, which possesses high power conversion efficiency exceeding 18%.

U.S. Pat. No. 4,611,091 discloses a method of forming a heterojunction buffer layer most suited to a light absorbing layer of CIS by chemically growing a thin film of CdS representing a compound semiconductor of II–VI group from a solution.

Japanese Laying-Open Patent Publication No. H-08-330614 describes a heterojunction buffer layer of ZnS which does not contain harmful metal such as cadmium and possesses high power conversion efficiency.

The above-described conventional methods of fabricating compound thin film solar cells involve such a common problem that, while the light absorbing layer is dipped in the solution, two processes of diffusing Zn or Cd element into the light absorbing layer and forming a ZnS or CdS film concurrently take place, which may easily cause variations in power conversion efficiency of the product from the crystallinity and surface conditions of the light absorbing layer.

The Chemical Bath Deposition (CBD) method may cause inclusion of impurities into a buffer layer to be formed on a light absorbing layer, which may have decreased quality.

The CBD method may also cause adhesion of ZnS to the inside wall of the bath and carriers transporting the substrates in the bath, thereby resulting in loss of ZnS and producing a large amount of waste solution.

SUMMARY OF THE INVENTION

Accordingly, an object of the present invention is to provide a method of fabricating a solar cell having an n-type buffer layer providing a heterojunction with a p-type light absorbing layer formed on a back electrode, wherein a stacked precursor is heat-treated in the selenium atmosphere to form the light absorbing layer on which a layer of powder or a coat of solution of sulfur compound containing n-type doping element is applied and heated at a temperature not lower than a fusing point of the sulfur compound and not higher than a heating temperature for heat-treatment of the stacked precursor to form the buffer layer. The above-described process can easily produce, without using the CBD, a buffer layer providing a tight, stable and high-quality p-n-junction with the light absorbing layer.

PREFERRED EMBODIMENT OF THE INVENTION

Figure 1:
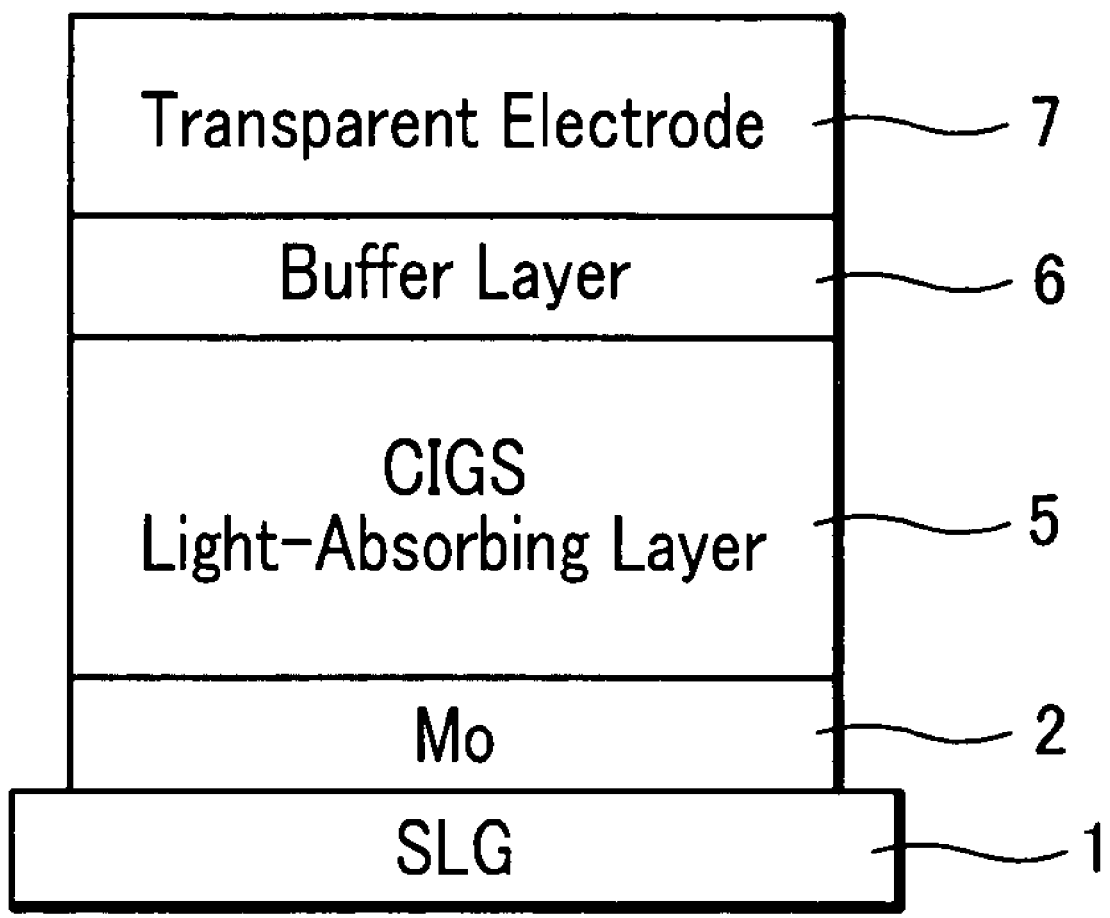
FIG. 1 is a sectional illustration of a basic structure of a solar cell of general compound semiconductors.
Figure 2:
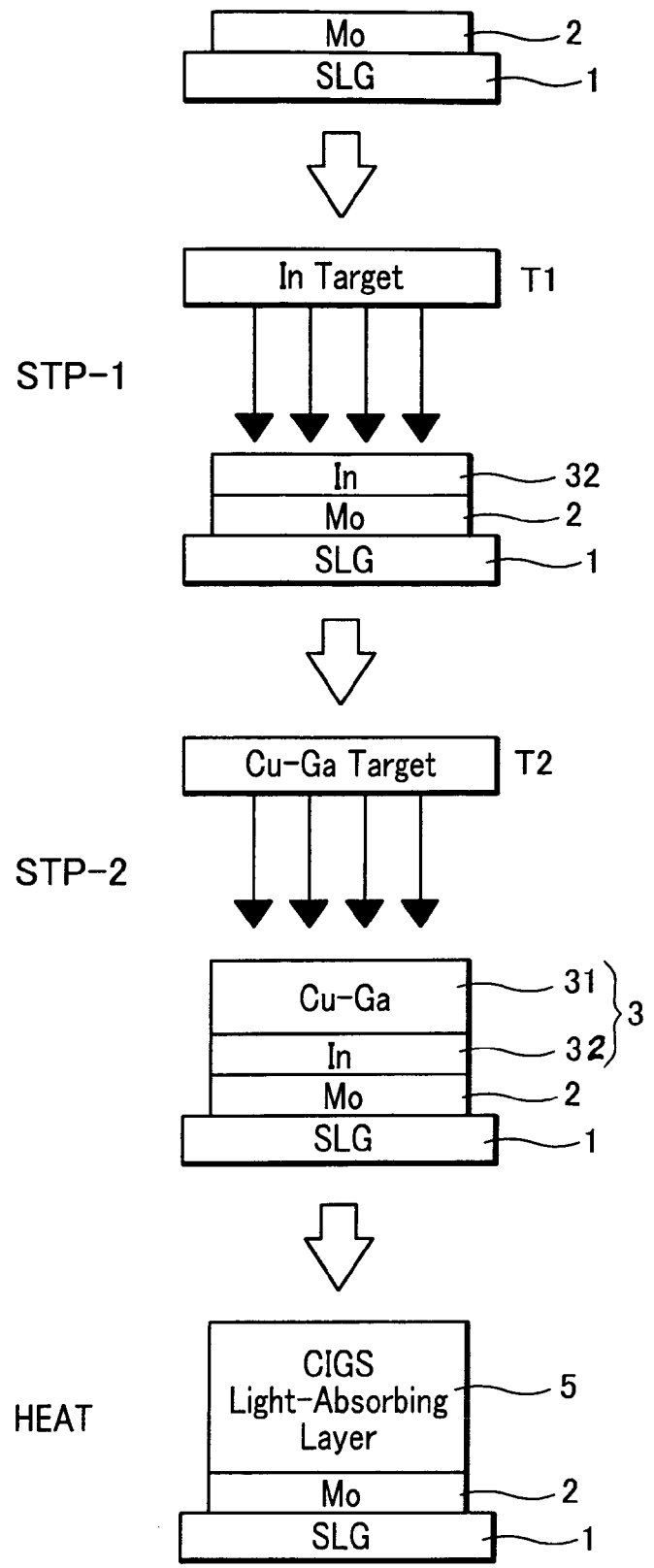
FIG. 2 illustrates an exemplary process of forming a back electrode and a light absorbing layer on a SLG (soda lime glass) substrate.
Figure 3:
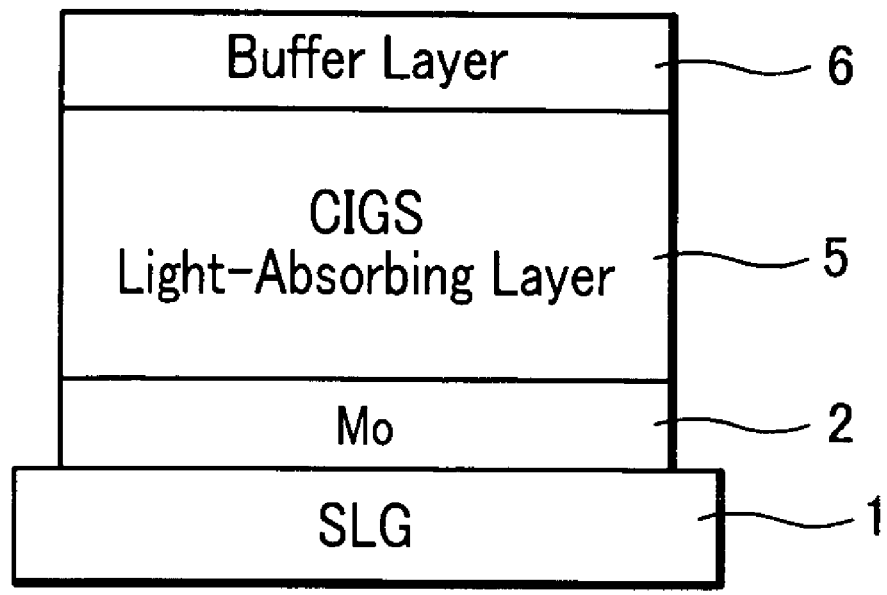
FIG. 3 illustrates a process of forming a buffer layer and a transparent electrode layer on a light absorbing layer.
Figure 3:
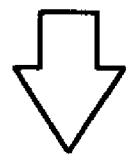
Figure 3:
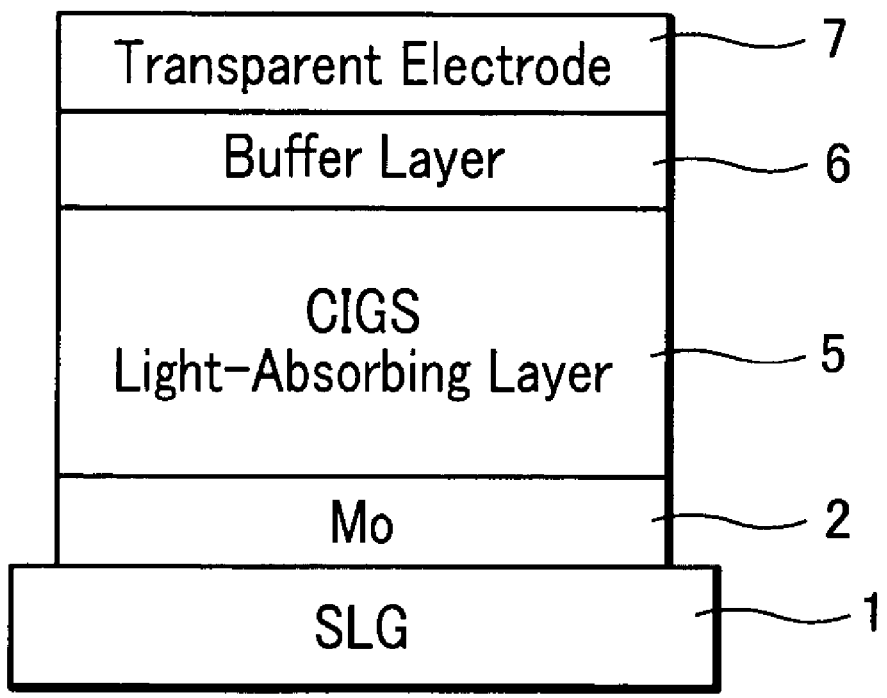

In FIGS. 2 and 3, there is shown a process of fabricating a compound semiconductor thin-film solar cell.

As shown in FIG. 2, a molybdenum (Mo) electrode layer 2 serving as a back electrode is first formed by sputtering on a SLG (soda lime glass) substrate 1. Next, an indium (In) layer 32 is formed on the back electrode layer 2 by the first sputtering process SPT-1 using a single In target T1 and a copper-gallium (Cu—Ga) alloy layer 31 is formed thereon by the second sputtering process SPT-2 using a Cu—Ga alloy target T2 to form a stacked metal precursor 3 composed of the In layer 32 and the Cu—Ga alloy layer 31. The precursor 3 is then treated by heat (by the heat treatment process HEAT) in the atmosphere of selenium (Se) to form a thin-film light absorbing layer 5 of CIGS.

As described above, a stacked precursor 3 is fabricated by forming first an In layer 32 and then a Cu—Ga alloy layer 31 on a Mo electrode layer 2, thereby preventing the formation of an alloy of elements diffused in solid phase at a boundary between the precursor 3 and the Mo electrode layer 2. This can also facilitate In components to sufficiently diffuse in the precursor on the side of the Mo electrode layer 2 in the process of selenizing the stacked precursor 3 by heating in the selenium atmosphere, simultaneously preventing slowly diffusing elements Ga from segregating at the boundary of the Mo electrode layer 2 and forming thereat a different alloy layer of Cu—Ga—Se which is inferior in its crystal structure. The CIGS light absorbing layer 5 thus fabricated can possess high quality P-type semiconductor structure featured by the homogeneous crystal structure of Cu(In+Ga)Se2. The light absorbing layer 5 can be featured by high performance and high strength of adhesion between the Mo electrode layer 2 and the light absorbing layer 5 and is free from the precipitation of a strange layer (Cu—Ga—Se layer) having an inferior crystal structure and possessing conductivity.

Consequently, a solar cell fabricated based on the thus fabricated light absorbing layer can possess high strength and is free from leakage from/to other cells when it is used in practice.

On the p-type light absorbing layer 5, as shown in FIG. 3, there is then formed an n-type buffer layer 6 for providing a heterojunction with the p-type layer 5 and is further formed a transparent electrode layer 7 of ZnO:Al, ITO by sputtering on the buffer layer 6.

Figure 4:
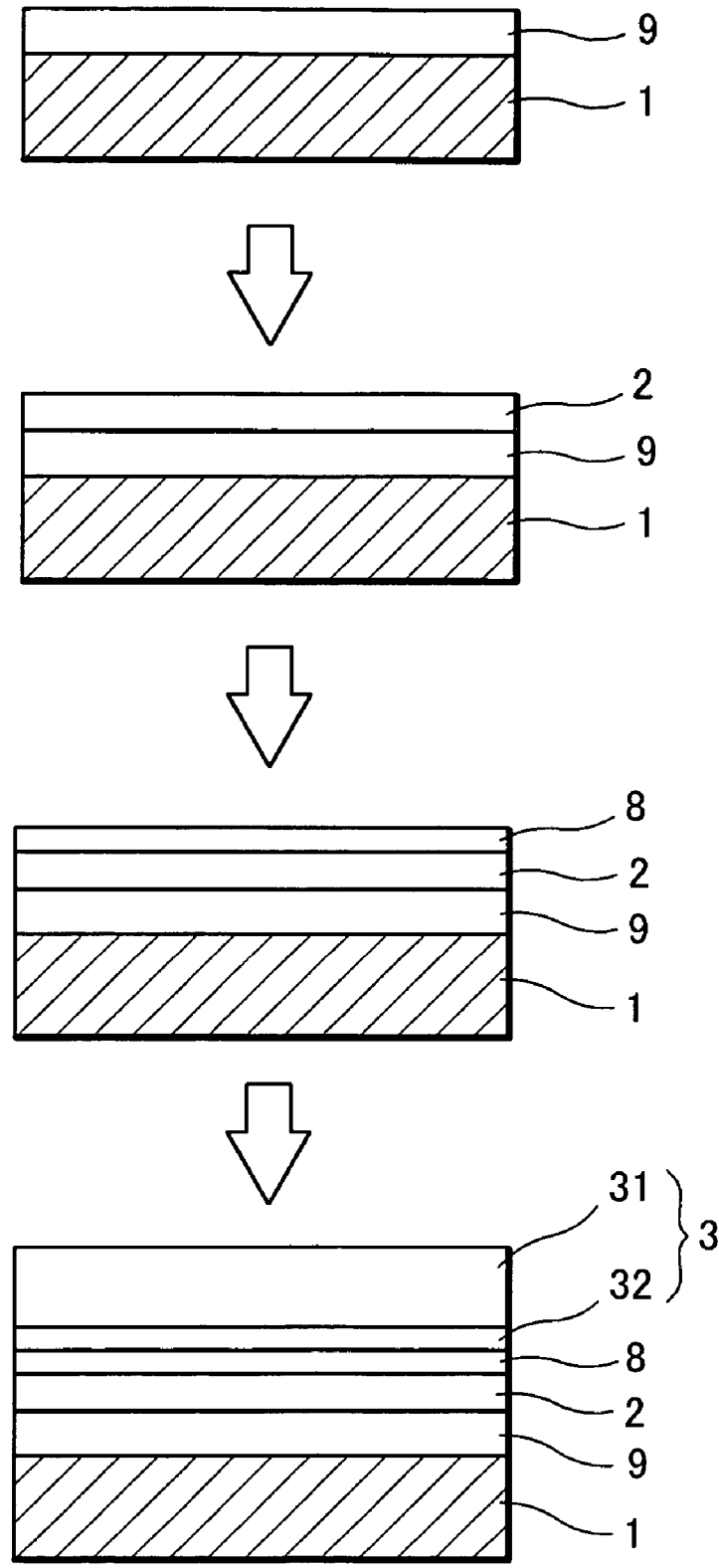
FIG. 4 illustrates a process of successively forming a diffusion control layer, a back electrode, an alkaline layer and a stacked precursor on a SLG substrate.
Figure 5:
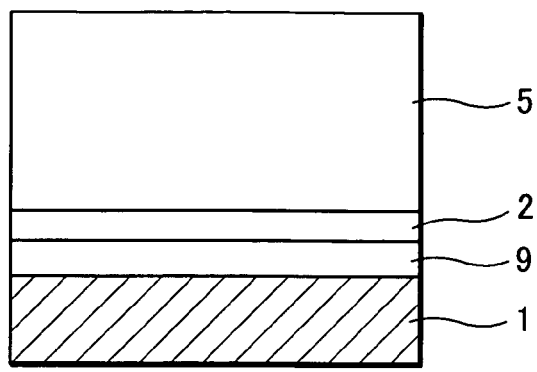
FIG. 5 illustrates a process of forming a light absorbing layer, a buffer layer and a transparent electrode on a SLG substrate with a diffusion control layer.
Figure 5:
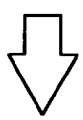
Figure 5:
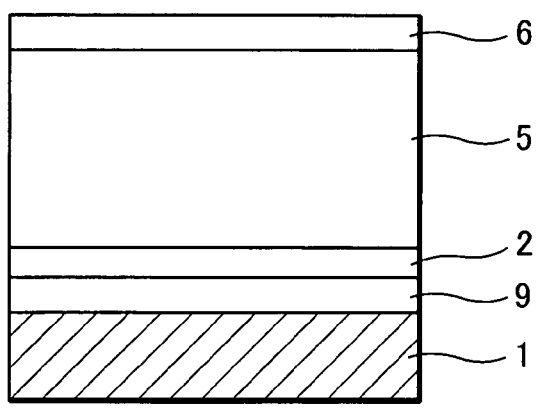
Figure 5:
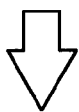
Figure 5:
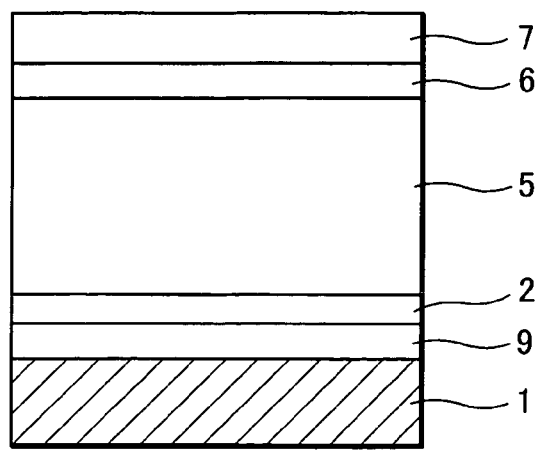

In FIGS. 4 and 5, there is shown another process of fabricating a compound semiconductor thin-film solar cell.

In this case, the Mo electrode 2 is covered with an alkaline layer 8 of Na2S formed thereon for facilitating diffusion of Na elements in the light-absorbing layer 5 when selenizing a stacked precursor 3.

The alkaline layer 8 is formed by a process by which a Mo-electrode layer 2 formed on the substrate is dipped in an aqueous solution prepared by desolving, e.g., Na2S.9H$_2$O (sodium-sulfide-9-hydrate) in pure water at a concentration of 0.1 to 5 wt. %, dried by spinning and then baked for 60 minutes at temperature of 150° C. in atmosphere for regulation of the content of remaining water in the formed film.

Furthermore, a diffusion control layer 9 of SiO$_2$ or Al$_2$O$_3$ is formed by a CVD method or a sputtering method between the SLG substrate 1 and the Mo electrode 2 to regulate the diffusion of Na elements from the SLG substrate into the light absorbing layer 5.

Figure 6:
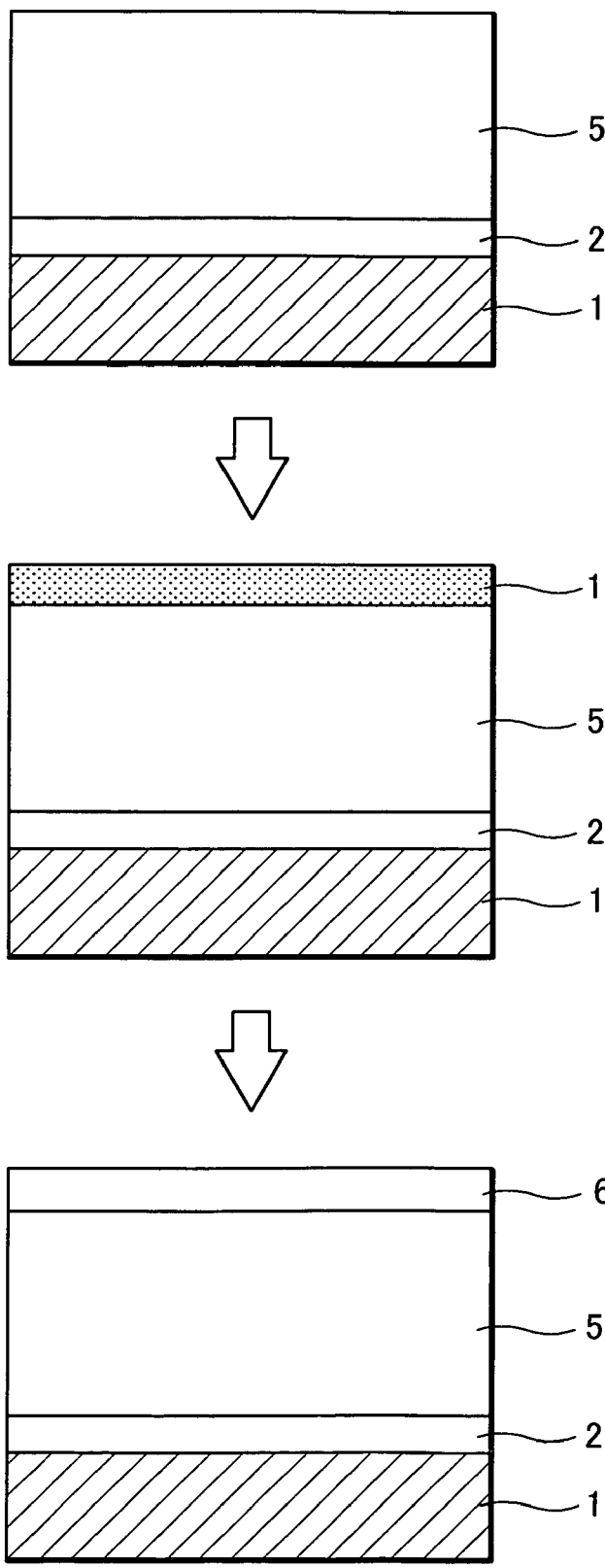
FIG. 6 illustrates a process of forming a buffer layer on a light absorbing layer on a SLG substrate according to the present invention.

A compound thin film solar cell having the above-mentioned structure according to the present invention is featured by the process of forming the buffer layer 6, which process is such that, as shown in FIG. 6, powder 10 of sulfur compound containing n-type doping element Zn (or Cd) is spread over the light absorbing layer 5 and then fused by heat to form the buffer layer 6. As the sulfur compound powder containing n-type doping element is used, for example, di-n-butyldithiocarbamic acid zinc [(C$_4$H$_9$)$_2$NCS$_2$]$_2$ Zn, dietyldithiocarbamic acid zinc [(C$_2$H$_5$)$_2$NCS$_2$]$_2$Zn or dimetyldithiocarbamic acid zinc [(C$_2$H$_3$)$_2$NCS$_2$]$_2$Zn.

The heat treatment of the buffer layer is conduced for 30 to 300 minutes at a temperature which is not lower than a fusing point of the sulfur compound and not higher than a heating temperature (e.g., 500° C.) for selenizing the stacked precursor 3 in the atmosphere of Se when forming the light absorbing layer 5.

Instead of using sulfur compound powder 10 containing n-type doping element Zn, a solution prepared by desolving sulfur compound doping element Zn in a solvent may be applied to the surface of the light absorbing layer 5 and fused thereto by heat to form the buffer layer 6 thereon.

The solution of sulfur compound containing n-type doping element Zn onto the surface of the light absorbing layer 5 may be directly dropped thereto with a spoon or the like. It is also possible to apply the solution by dip-coating, spray-coating, spin-coating or screen printing.

The solvent used for preparing the solution of the sulfur compound may be an organic solvent such as toluene, acetone or ethanol. It can be evaporated by heat.

Thickness of the buffer layer formed on the light absorbing layer may be suitably regulated by controlling the mass of the sulfur compound powder 10 containing n-type doping element Zn or the concentration of the solution of sulfur compound containing n-type doping element Zn or the method for applying the powder or solution.

An amount of Zn elements diffused into the light absorbing layer 5 is regulated by controlling the heating temperature and heating time.

In practice, we have obtained a high quality buffer layer formed on the light absorbing layer by the process wherein 0.4–0.5 g/cc of a solution prepared by desolving di-n-butyldithiocarbamic acid zinc in acetone or ethanol was coated over the light absorbing layer surface and heated at 250° C. for 3 hours.

The buffer layer 6 after heat-treatment may be etched with hydrochloric acid to remove excessive adhesive matters from the surface of the buffer layer if necessary.

According to the present invention, since aZnS-layer or a CdS-layer is formed by providing a single material of sulfur compound containing n-type doping element Zn (or Cd) on a light absorbing layer and then fusing the material on the light absorbing layer surface without using the CBD method, it becomes possible to obtain a high-quality buffer layer 6 having high purity with no inclusion of impurities, which is tightly adhered to the light absorbing layer 5 to form a high-quality p-n conjunction therewith. According to the present invention, no barrier between the light-absorbing layer and the transparent electrode 7 can be formed and the deterioration of property of the product from the recombination of elements can be effectively prevented.

INDUSTRIAL APPLICABILITY

As is apparent from the foregoing, according to the present invention, it is possible to provide a method of fabricating a solar cell having an n-type buffer layer providing a heterojunction with a p-type light absorbing layer formed on a back electrode, wherein a stacked precursor is heat-treated in the selenium atmosphere to form the light absorbing layer on which a layer of powder or a coat of solution of sulfur compound containing n-type doping element is applied and heated at a temperature not lower than a fusing point of the sulfur compound and not higher than a heating temperature for heat-treatment of the stacked precursor to form the buffer layer. The above-described process can easily produce a buffer layer providing stable and high-quality p-n-junction with the light absorbing layer.

This process can easily produce a buffer layer providing a tight, stable and high-quality p-n junction with the light absorbing layer and can effectively prevent deterioration of the light absorbing layer from recombination of elements thanks to no barrier with the transparent electrode.

The invention claimed is:

1. A method of fabricating a thin-film compound solar cell having an n-type buffer layer formed therein for providing a heterojunction with a p-type compound semiconductor light-absorbing layer formed on a back electrode, wherein the light absorbing layer is formed by heat-treating a stacked precursor in a selenium atmosphere and the buffer layer is formed on said light absorbing layer by spreading a powder of a sulfur compound containing n-type doping element over a surface of the light absorbing layer and heating at a temperature in a range from a fusing point of the sulfur compound to a temperature of treating the stacked precursor, and wherein the sulfur compound containing n-type doping element is di-n-butyldithiocarbamic acid zinc or dietyldithiocarbamic acid zinc or dimetyldithiocarbamic acid zinc.

2. A method of fabricating a thin-film compound solar cell having an n-type buffer layer formed therein for providing a heterojunction with a p-type compound semiconductor light-absorbing layer formed on a back electrode, wherein the light absorbing layer is formed by heat-treating a stacked precursor in a selenium atmosphere and the buffer layer is formed on said light absorbing layer by applying a solution prepared by dissolving in an organic solvent a sulfur compound containing n-type doping element to a surface of the light absorbing layer and heating at a temperature in a range from a fusing point of the sulfur compound to a temperature of treating the stacked precursor, and wherein the sulfur compound containing n-type doping element is di-n-butyldithiocarbamic acid zinc, dietyldithiocarbamic acid zinc or dimetyldithiocarbamic acid zinc.

* * * * *